(12) United States Patent
Quilici

(10) Patent No.: US 7,477,128 B2
(45) Date of Patent: Jan. 13, 2009

(54) MAGNETIC COMPONENTS

(75) Inventor: James E. Quilici, El Dorado Hills, CA (US)

(73) Assignee: Radial Electronics, Inc., El Dorado Hills, CA (US)

( * ) Notice: Subject to any disclaimer, the term of this patent is extended or adjusted under 35 U.S.C. 154(b) by 20 days.

(21) Appl. No.: 11/233,824

(22) Filed: Sep. 22, 2005

(65) Prior Publication Data

US 2007/0063807 A1    Mar. 22, 2007

(51) Int. Cl.
*H01F 5/00* (2006.01)
(52) U.S. Cl. .................. 336/223; 336/232; 336/200
(58) Field of Classification Search ................ 336/200, 336/223, 232
See application file for complete search history.

(56) References Cited

U.S. PATENT DOCUMENTS 5,372,967 A * 12/1994 Sundaram et al. ........... 438/381
5,959,846 A * 9/1999 Noguchi et al. ............. 361/782
6,148,500 A * 11/2000 Krone et al. ................ 29/602.1
6,535,085 B2 * 3/2003 Song et al. .................. 333/219
6,686,824 B1 * 2/2004 Yamamoto .................. 336/200
6,768,409 B2 * 7/2004 Inoue et al. ................. 336/200
6,990,729 B2 * 1/2006 Pleskach et al. ............. 29/606
7,196,607 B2 * 3/2007 Pleskach et al. ............. 336/200
2005/0122199 A1 * 6/2005 Ahn et al. ................... 336/200

* cited by examiner

*Primary Examiner*—Anh T Mai
(74) *Attorney, Agent, or Firm*—Silicon Forest Patent Group; Paul J Fordenbacher, Esq.

(57) ABSTRACT

Disclosed is an apparatus and method for a magnetic component. The magnetic component includes a substrate having a feature and a first conductive pattern disposed on the feature. The magnetic component also includes a permeability material disposed within the feature. A substrate material is disposed on the substrate to facilitate substantial enclosure of the permeability material between the substrate and the substrate material, where the substrate material has a second conductive pattern. The first conductive pattern and the second conductive pattern cooperate to be capable of facilitating magnetic properties of the permeability material.

52 Claims, 7 Drawing Sheets

(Section A-A)

(Section B-B)

MAGNETIC COMPONENTS

BACKGROUND

1. Technical Field

The disclosure generally relates to magnetic components.

2. Information

Wide range of electronic devices may have various magnetic components. Magnetic components may be capable of providing various functions. For example, magnetic components in electronic devices may function as transformers, inductors, filters, and so forth.

Commonly, in order to have magnetic properties, magnetic components may comprise of an assembly of one or more wires wound around a material having permeability properties such as ferromagnetic material having a toroidal type shape, a rod type shape, etc. When a current is applied to the one or more wires, the component may produce a magnetic field, which may be utilized to address a wide range of electrical needs associated with electronic devices.

BRIEF DESCRIPTION OF THE DRAWINGS

Embodiments are illustrated by way of example and not by way of limitation in the figures of the accompanying drawings, in which like references may indicate similar elements and in which.

DETAILED DESCRIPTION

In the following description, embodiments will be disclosed. For purposes of explanation, specific numbers, materials, and/or configurations are set forth in order to provide a thorough understanding of the embodiments. However, it will also be apparent to those skilled in the art that the embodiments may be practiced without one or more of the specific details, or with other approaches, materials, components, etc. In other instances, well-known structures, materials, and/or operations are not shown and/or described in detail to avoid obscuring the embodiments. Accordingly, in some instances, features are omitted and/or simplified in order to not obscure the disclosed embodiments. Furthermore, it is understood that the embodiments shown in the figures are illustrative representations and are not necessarily drawn to scale.

References throughout this specification to "one embodiment" or "an embodiment" means that a particular feature, structure, material, and/or characteristic described in connection with the embodiment is included in at least one embodiment. Thus, the appearances of the phrases "in one embodiment" and/or "in an embodiment" in various places throughout this specification are not necessarily all referring to the same embodiment. Furthermore, the particular features, structures, materials, and/or characteristics may be combined in any suitable manner in one or more embodiments.

For the purposes of the subject matter disclosed herein, substrates may include a wide range of substrates such as, but not limited to, plastic type substrates, metal type substrates, semiconductor type substrates, and so forth. Accordingly, it should appreciated by those skilled in the art that types of substrates may vary widely based at least in part on its application. However, for the purposes of describing the subject matter, references may be made to a substrate along with some example types, but the subject matter is not limited to a type of substrate. Additionally, for the purposes of describing various embodiments, references may be made to magnetic components. However, it should be appreciated by those skilled in the relevant art that magnetic components may include a wide variety of magnetic components such as, but not limited to transformer type components, inductor type components, filter type components, and so forth, and accordingly, the claimed subject matter is not limited in scope in these respects.

Figure 1:
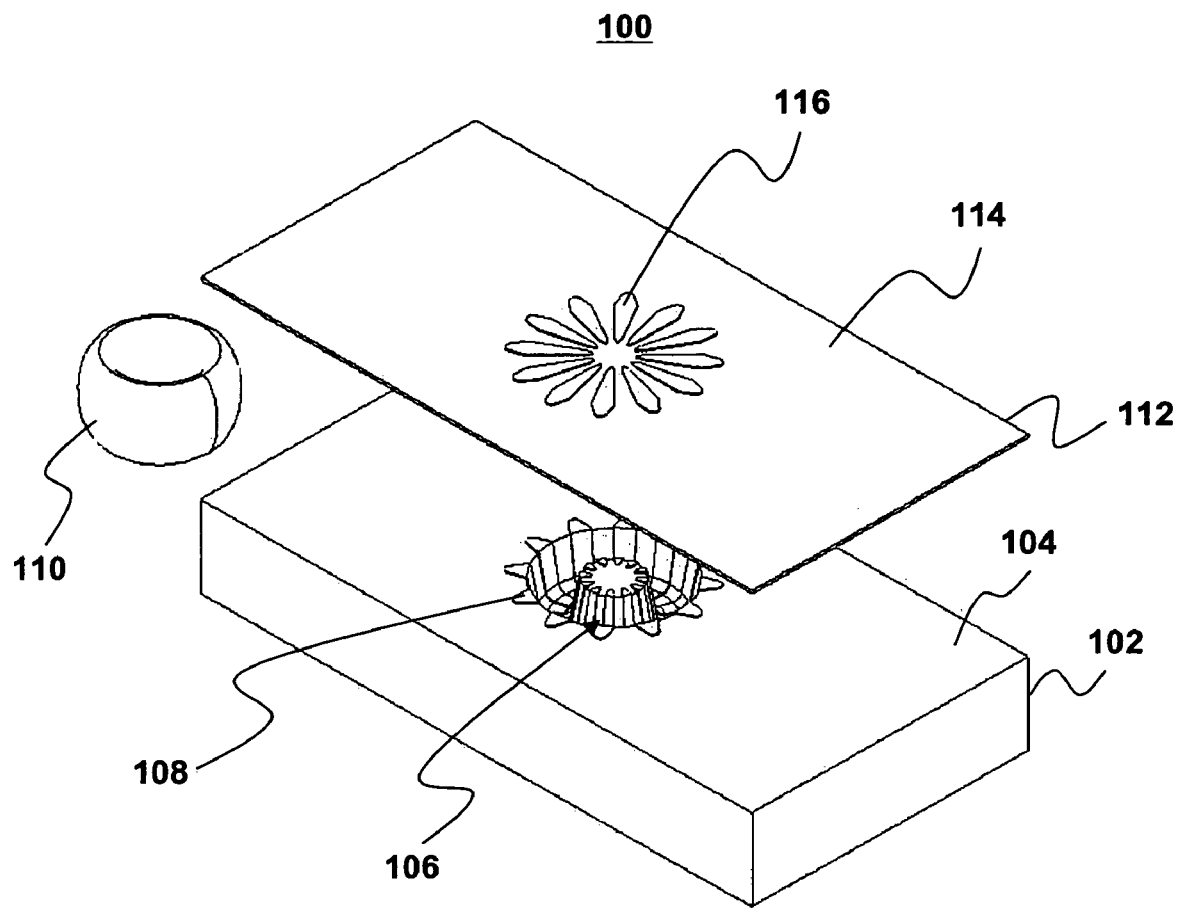
FIG. 1 illustrates a perspective exploded view of a magnetic component in accordance with one embodiment.

Turning now to the figures, FIG. 1 illustrates a perspective exploded view of a magnetic component in accordance with one embodiment. As shown in FIG. 1, magnetic component 100 may comprise of a substrate 102 having a first surface 104 and a feature 106. A first conductive pattern 108 may be disposed on the feature 106. A permeability material 110 may be disposed within the feature 106. Additionally, in the illustrated embodiment, a substrate material 112 may be disposed on the first surface 104 and on the feature 106, thereby forming a second surface 114. Disposed on the second surface 114 may be a second conductive pattern 116. As will be further described in detail, first conductive pattern 108 and second conductive pattern 116 cooperate to be capable of facilitating magnetic properties of permeability material 110 in accordance with various embodiments.

It should be appreciated that FIG. 1 illustrates an exploded view to describe an embodiment of the claimed subject matter, and accordingly, as will be described in further detail, magnetic component 100 may have permeability material 110 substantially enclosed within feature 106 with substrate material 112 substantially covering the permeability material 110. First conductive pattern 106 and second conductive pattern 116 may substantially surround the permeability material, thereby forming a winding type relationship.

Continuing to refer to FIG. 1, substrate 102 is shown having a substantially rectangular type shape. However, it should be appreciated that substrate 102 may have any type of shape such as, but not limited to, substantially circular, substantially square, or any other type of polygonal shape. Additionally, substrate 102 may comprise of many types of material such as, but not limited to, material suitable for printed circuit boards (PCBs), various plastic type materials, material suitable for injection molding and so forth. For example, in one embodiment, substrate 102 may comprise of a thermoplastic type material such as, but not limited to, polyetherimide (PEI) type material. In another embodiment, substrate 102 may comprise of a resin type material that may be suitable for injection type molding such as, but not limited to, liquid crystal polymer type material. It should be appreciated by those skilled in the relevant art that the shape and materials described are merely examples, and the claimed subject matter is not limited in scope in these respects.

In FIG. 1, feature 106 is illustrated as a cup type feature below the first surface 104. That is, feature 106 may comprise of a depression in the first surface 104 of substrate 102. Further, in the illustrated embodiment of FIG. 1, feature 106 may comprise of a toroidal type shape depression below first surface 104 into the body of substrate 102. However, it should be appreciated by those skilled in the relevant art that feature 106 may have a wide range of shapes such as, but not limited to, a rod type shape, oblong type shape, and so forth, and accordingly, the claimed subject matter is not limited in scope in these respects.

A variety of approaches may be utilized in order to facilitate formation of feature 106. For example, in one embodiment, feature 106 may be formed by utilizing a lithography type process such as, but not limited to photolithography. In another embodiment, feature 106 may be formed by utilizing a machining type process such as, but not limited to, a micromachining process. Various approaches may be utilized to facilitate formation of a feature, and accordingly, the claimed subject matter is not limited to a particular approach.

As shown in FIG. 1, first conductive pattern 108 may be disposed in a pattern around the inside of feature 106. In the illustrated embodiment, first conductive pattern 108 may be disposed in a manner whereby first conductive pattern 108 substantially lines portions of the inside surfaces of the feature 106. Here too, a variety of approaches may be utilized in order to dispose the first conductive pattern 108. In one embodiment, first conductive pattern 108 may be disposed by utilizing a stamping type approach such as, but not limited to, stamping a conductive pattern on a substrate. In another embodiment, first conductive pattern 108 may be disposed by utilizing a plating type approach such as, but not limited to, chemical and/or electroplating a conductive pattern on a substrate. In another embodiment, first conductive pattern 108 may be disposed by utilizing a lithography type approach such as, but not limited to, photolithography. In yet another embodiment, an structuring type approach such as, but not limited to, laser structuring type approach may be utilized to dispose first conductive pattern 108. Various approaches may be utilized to dispose a conductive pattern, and accordingly, the claimed subject matter is not limited to a particular approach.

First conductive pattern 108 may comprise of a wide variety of materials such as, but not limited to, copper, aluminum, gold, and various types of conductive tracing materials. Accordingly, the claimed subject matter is not limited in scope in these respects.

Continuing to refer to FIG. 1, permeability material 110 is shown as having a shape based at least in part on the shape of the feature 106. That is, permeability material 110 may have a substantially toroidal shape that may substantially fit within the feature 106. In the embodiment of FIG. 1, permeability material 110 may be shown as a separate solid object, where the solid object may be placed within the feature 106 by various methods such as, but not limited to, utilizing a pick and place machine. However, in another embodiment, permeability material 110 may be of a liquid type form whereby the liquid type form may be poured into a feature. In another embodiment, permeability material 110 may be in the form of a powder type material whereby the powder type material may be disposed into a feature. In yet another embodiment, permeability material 110 may comprise of material that may be utilized with a vibration based type approach to facilitate placement of the permeability material substantially within the feature 106. That is, a method by which a vibration type machine may be utilized. Accordingly, the claimed subject matter is not limited in scope in these respects.

Permeability material 110 may comprise of a wide variety of materials such as, but not limited to, ferromagnetic type materials that may include ferrite type materials, iron type material, metal type materials, metal alloy type materials, and so forth. Additionally, permeability material 110 may comprise of materials based at least in part on the particular utilization of a magnetic component. For example, a magnetic component to be utilized as an isolation transformer may include a permeability material having a relatively high permeability, such as, but not limited to 10000 Henry per meter. In another example, a magnetic component to be utilized as a common mode filter may include a permeability material having a moderate permeability such as, but not limited to, 1000 Henry per meter. Further, as previously alluded to, the size and shape of the permeability material 110 may be based at least in part on the utilization of the magnetic component as well. Accordingly, the claimed subject matter is not limited in scope in these respects.

In FIG. 1, for the purposes of describing the embodiment, substrate material 112 may be shown as a thin layer. However, the thin layer may be representative of one or more layers of printed circuit layers to be disposed on the first surface 104 of the substrate 102 and does not necessarily denote a single piece of substrate material, but it also could be a single piece of substrate material. Additionally, the substrate material 112 does not necessarily need to substantially match the material of the substrate 102 and may be of a different material. For example, in one embodiment, the substrate material 112 may include various lamination layers that facilitate build up of circuit layers. In another embodiment, a liquid type material may be disposed on the on a substrate such as, but not limited to, a liquid dielectric type material. For example, a liquid type dielectric type material may be disposed by utilizing at least one of a spray type, roller type, and/or a squeegee type approach. It should be appreciated by those skilled in the relevant art that the substrate material 112 may be disposed on the first surface 104 of the substrate 102 by a wide variety of approaches. Accordingly, the claimed subject matter is not limited to any one particular approach.

In the embodiment illustrated in FIG. 1, second conductive pattern 116 is shown on the second surface 114 of substrate material 112. However, as previously described, second conductive pattern 116 may be disposed on the substrate material 112 utilizing a variety of approaches such as, but not limited to, a lamination approach, lithography approach, etching approach, a screen printing type approach, a laser structuring type approach, and so forth. That is, second conductive pattern 116 may be disposed as part of the process of providing substrate material 112, and accordingly, the claimed subject matter is not limited in these respects.

In the embodiment of FIG. 1, second conductive pattern 116 substantially matches the pattern of the first conductive pattern 108 to facilitate wrapping of the permeability material 110 between the first conductive pattern 108 and the second conductive pattern 116. Additionally, first conductive pattern 108 and second conductive pattern 116 may be electrically coupled by various vias and/or interconnects as will be described in detail. Together, first conductive pattern 108 and the second conductive pattern 116 cooperate to be capable of facilitating magnetic properties of the permeability material 110. For example, first conductive pattern 108 and second conductive pattern 116 may cooperate to be capable of inducing a magnetic field upon the permeability material 110.

Figure 2A:
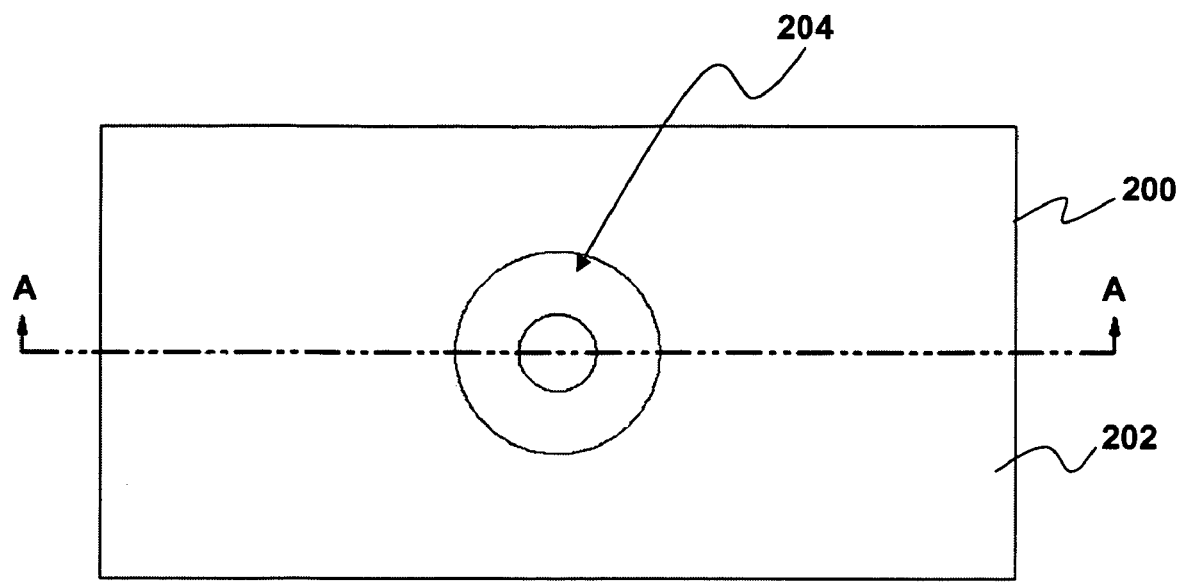
FIGS. 2A-2B illustrate a top view and a sectional view of a substrate having a feature in accordance with one embodiment.
Figure 2B:
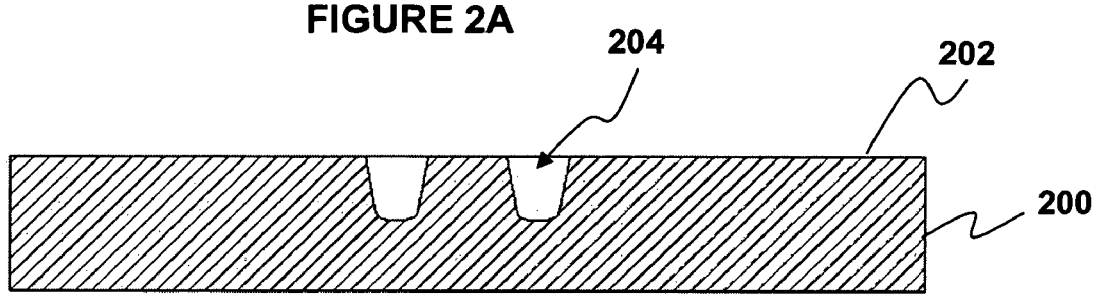

FIGS. 2A-2B illustrate a top view and a sectional view of a substrate having a feature in accordance with one embodiment. In FIG. 2A, a substrate 200 may have a surface 202 and a feature 204. As shown in FIG. 2B, feature 204 may be formed into the substrate 204 below the surface 202. In this embodiment, the feature 204 may have a substantially toroidal shape formed as a depression type feature into the substrate 200. As previously described, feature 204 may be formed by utilizing a wide variety of approaches and may have a variety of shapes, and accordingly, the claimed subject matter is not limited in these respects.

Figures 3A, 3B, 3C:
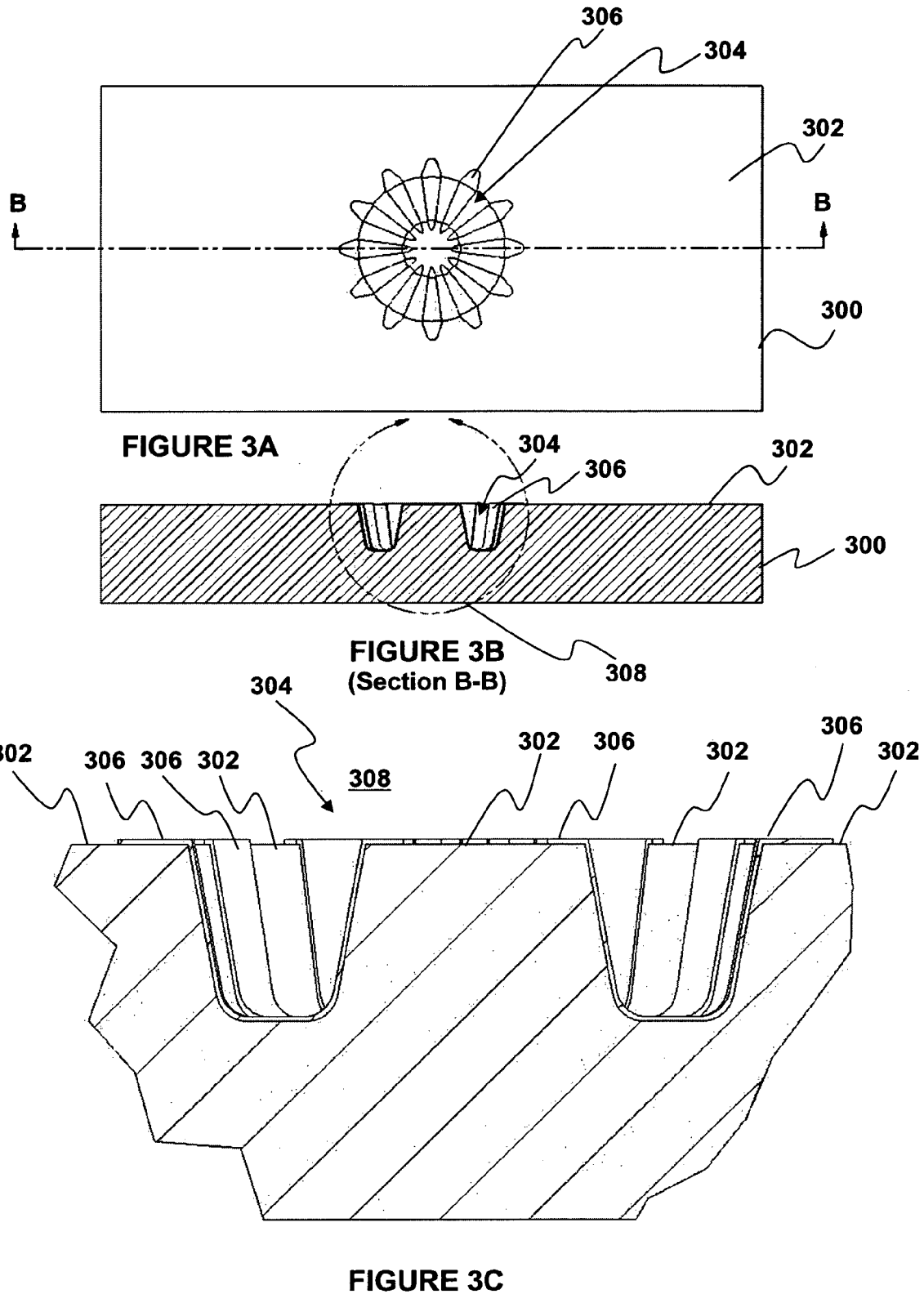
FIGS. 3A-3C illustrate a top view, a section view, and a detail view of a substrate having a feature and a conductive pattern disposed within the feature in accordance with one embodiment.

FIGS. 3A-3C illustrate a top view, a section view, and a detail view of a substrate having a feature and a conductive pattern disposed within the feature in accordance with one embodiment. Referring to FIG. 3A, a substrate 300 may have a surface 302, a feature 304, and a conductive pattern 306. As shown in FIG. 3A, feature 304 may have a substantially toroidal type shape, and correspondingly, conductive pattern 306 may be patterned circumferentially around the feature 304 (i.e., a wheel type pattern radiating from the center of the toroid). Turning to FIG. 3B, in the illustrated embodiment, conductive pattern 306 has a portion on the surface 302 and partly covers the walls of the feature 304 (i.e., feature areas below surface 302). Detail 308 is illustrated in FIG. 3C, where conductive pattern 306 is shown provided on surface 302, inside feature 304, and back on surface 302.

As previously described, once the conductive pattern 306 is disposed on the feature 304, a permeability material may be disposed within the feature 304. A substrate material may be disposed on the surface 302 having a second conductive pattern. Various conductive paths such as, but not limited to, vias and/or interconnects (not shown) may be formed and utilized to electrically couple the two conductive patterns, thereby forming a winding type structure around a permeability material.

Figure 4:
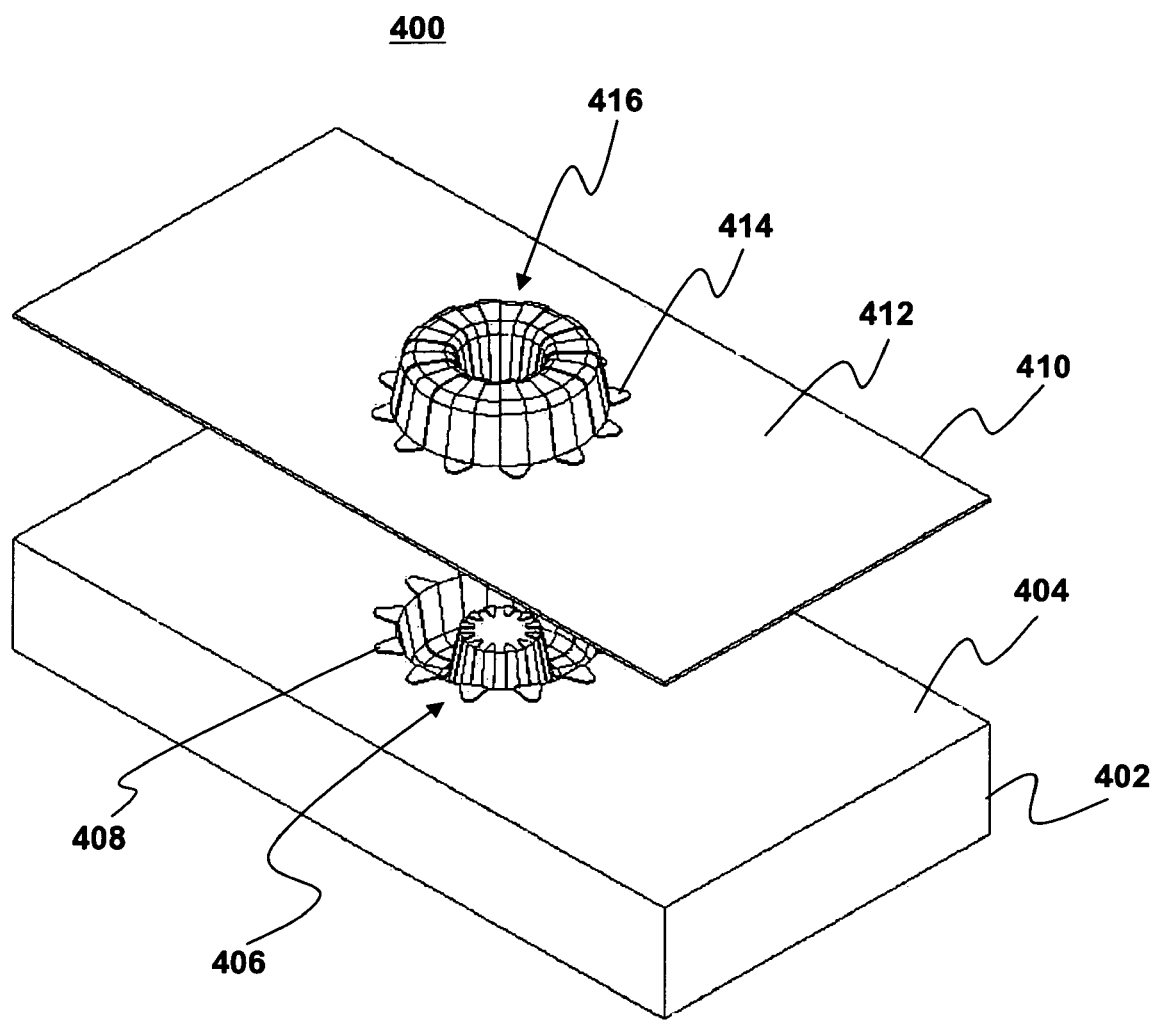
FIG. 4 illustrates a perspective exploded view of a magnetic component in accordance with another embodiment.

FIG. 4 illustrates a perspective exploded view of a magnetic component in accordance with another embodiment. In FIG. 4, similar to magnetic component 100 (shown in FIG. 1), magnetic component 400 may include a substrate 400, a first surface 404, a feature 406, a first conductive pattern 408, a substrate material 410, a second surface 412, and a second conductive pattern 414. However, in this embodiment, a permeability material (not shown) may be relatively large based at least in part on its application. Accordingly, a second feature 416 may be formed on the substrate material 410 to facilitate accommodation of the permeability material. As shown, second conductive pattern 414 may be disposed to at least partially cover the surfaces of the second feature 416. As previously described, substrate material 410 may be disposed on the substrate utilizing various approaches such as, but not limited to, a lamination type approach, where a sheet of substrate material having a second feature may be disposed on a substrate. Alternatively, substrate material may be disposed utilizing an etching type approach, where the second feature 416 may be the result of covering the permeability material that extends out of the surface 404. Further, substrate material may be disposed utilizing a spray type, roller type, and/or a squeegee type approach. Accordingly, the claimed subject matter is not limited to a particular approach.

Here again, various approaches may be utilized for disposing conductive patterns. For example, one such approach may be a lithography type approach utilizing various etching methods, and another approach may be to utilize a stamping type approach, a laser structuring type approach, and so forth.

Conductive patterns may be patterned to facilitate various magnetic properties for various magnetic components based at least in part on their applications. Further, because an approach that may be utilized in providing the number of conductive patterns may be of a lithography type approach, laser structuring type approach, etc., precision of the conductive patterns may be relatively high based at least in part on the type approaches utilized such as, but not limited to, a high aspect lithography approach of ultraviolet photolithography, and accordingly, the claimed subject matter is not limited to a particular approach.

In various embodiments, one or more magnetic components may be formed on a single substrate. Additionally, because the magnetic properties of a magnetic component may be based at least in part on its conductive pattern, its feature size, permeability material utilized, and/or so forth, more than a single type of magnetic component may be formed from a single substrate, and accordingly, the claimed subject matter is not limited in these respects.

Examples of magnetic components may include a magnetic component including a substrate having a feature, a first conductive pattern, a permeability material, a substrate material, and a second conductive pattern, where the first conductive pattern and the second conductive pattern cooperate to be capable of facilitating magnetic properties of the permeability material for various applications. Various applications may include applications such as, but not limited to a dual common mode filter, a single common mode filter, a single inductor, an isolation transformer, and so forth, and accordingly, the claimed subject matter is not limited in these respects. Various embodiments of various magnetic components, without limitations, may be illustrated in FIGS. 5-8.

Figure 5:
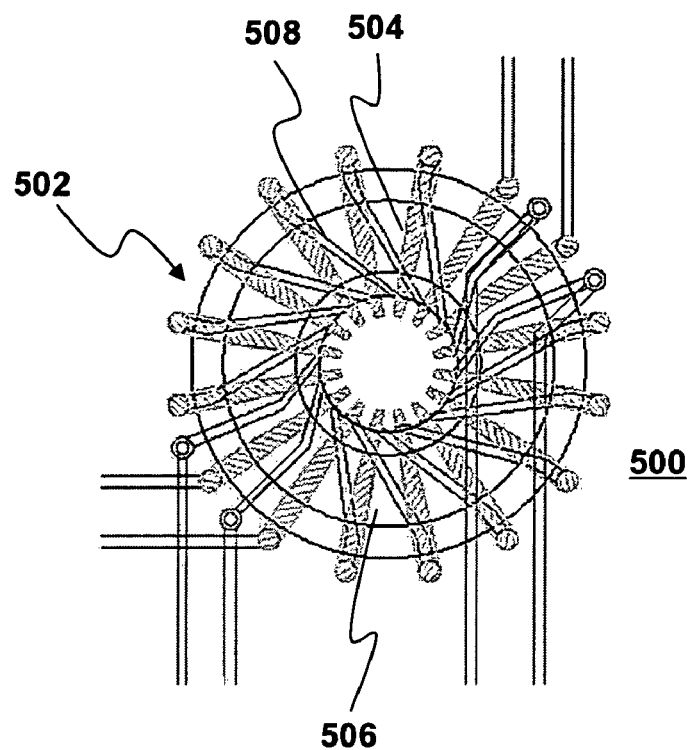
FIG. 5 illustrates a schematic of a magnetic component in accordance with an embodiment.
Figure 5:
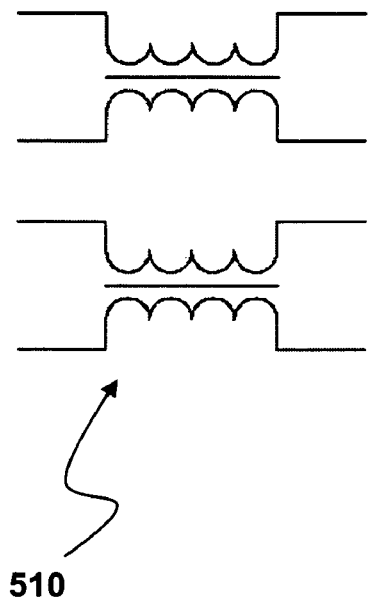

Turning now to FIG. 5, a magnetic component 500 may include a substrate (not shown) having a feature 502, a first conductive pattern 504, a permeability material 506, a substrate material (not shown), and a second conductive pattern 508. The first conductive pattern 504 and the second conductive pattern 508 cooperate to be capable of facilitating magnetic properties of the permeability material 506, and in this particular embodiment, magnetic component 500 may be capable of being utilized as a dual common mode filter (i.e., a common mode filter type functionality) as shown by related circuit illustration 510. It should be appreciated that the substrate and substrate material are not shown in order to better illustrate the embodiment.

Figure 6:
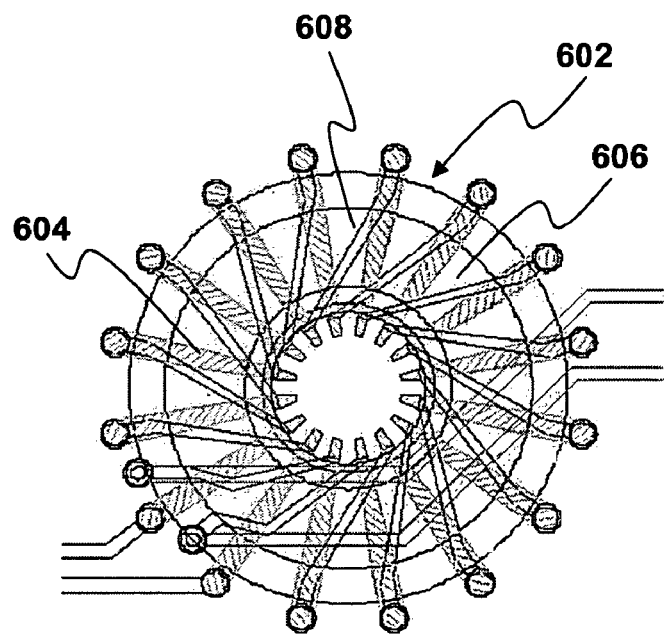
FIG. 6 illustrates a schematic of a magnetic component in accordance with another embodiment.
Figure 6:
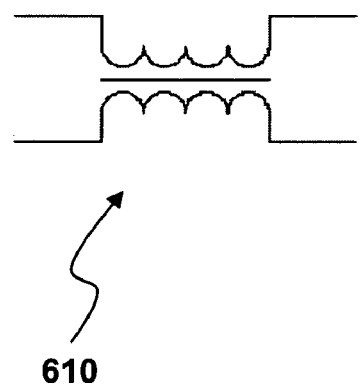

FIG. 6 illustrates a schematic of a magnetic component in accordance with another embodiment. In FIG. 6, magnetic component 600 may include a substrate (not shown) having a feature 602, a first conductive pattern 604, a permeability material 606, a substrate material (not shown), and a second conductive pattern 608. The first conductive pattern 604 and the second conductive pattern 608 cooperate to be capable of facilitating magnetic properties of the permeability material 606, and in this particular embodiment, magnetic component 600 may be capable of being utilized as a single common mode filter (i.e., a single common mode filter functionality) as shown by related circuit illustration 610.

Figure 7:
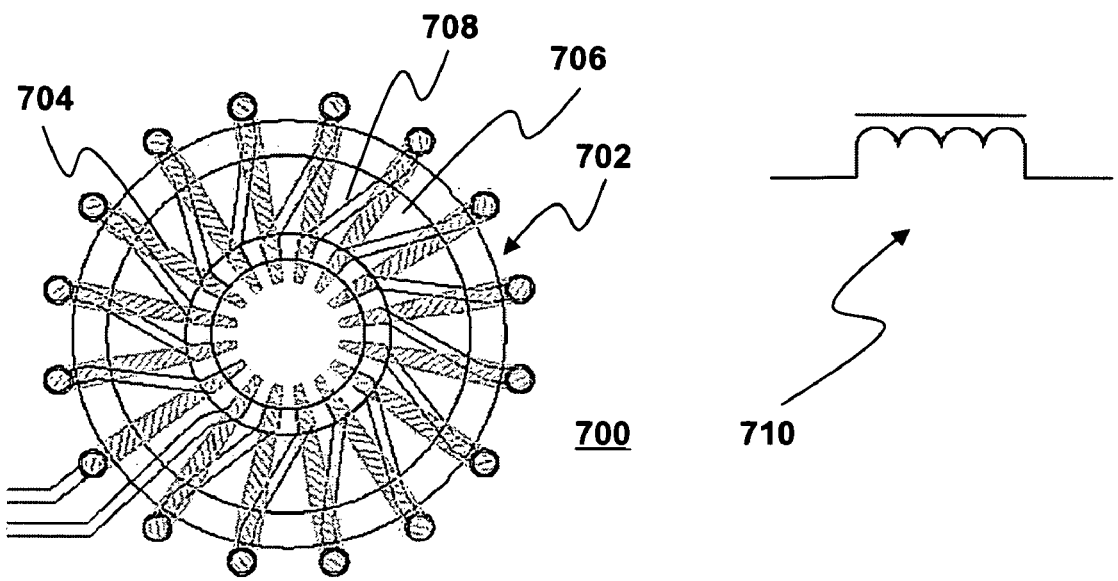
FIG. 7 illustrates a schematic of a magnetic component in accordance with another embodiment.

FIG. 7 illustrates a schematic of a magnetic component in accordance with another embodiment. In FIG. 7, magnetic component 700 may include a substrate (not shown) having a feature 702, a first conductive pattern 704, a permeability material 706, a substrate material (not shown), and a second conductive pattern 708. The first conductive pattern 704 and the second conductive pattern 708 cooperate to be capable of facilitating magnetic properties of the permeability material 706, and in this particular embodiment, magnetic component 700 may be capable of being utilized as a single inductor (i.e., an inductor type functionality) as shown by related circuit illustration 710.

Figure 8:
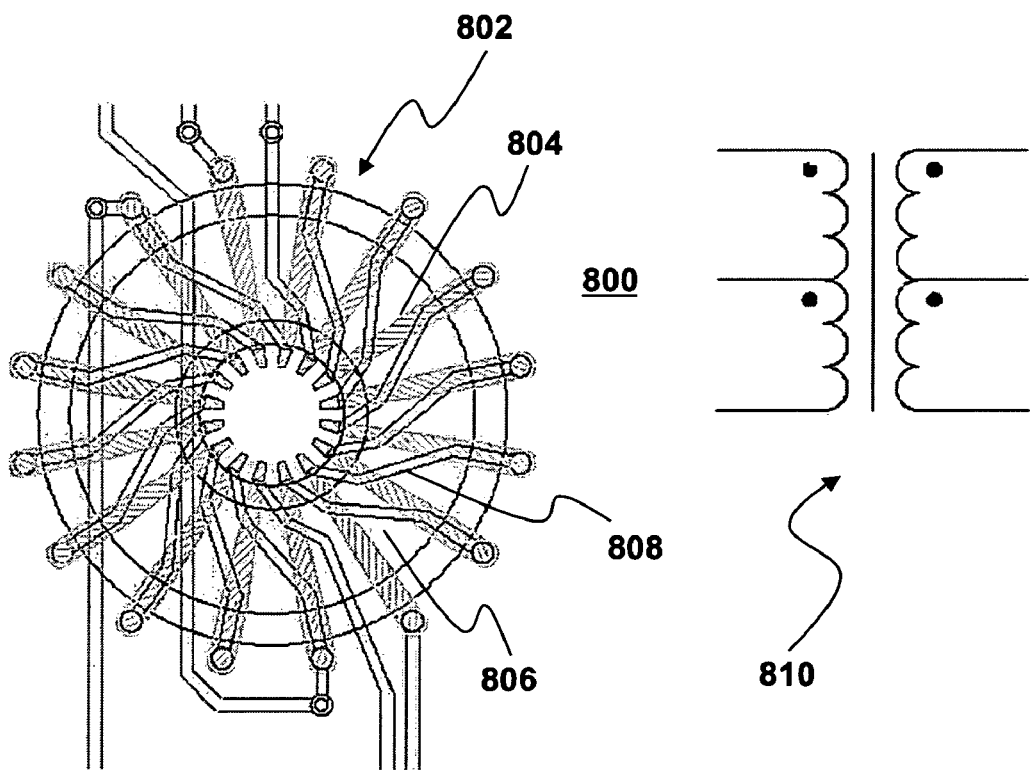
FIG. 8 illustrates a schematic of a magnetic component in accordance with another embodiment.

FIG. 8 illustrates a schematic of a magnetic component in accordance with another embodiment. In FIG. 8, magnetic component 800 may include a substrate (not shown) having a feature 802, a first conductive pattern 804, a permeability material 806, a substrate material (not shown), and a second conductive pattern 808. The first conductive pattern 804 and the second conductive pattern 808 cooperate to be capable of facilitating magnetic properties of the permeability material 806, and in this particular embodiment, magnetic component 800 may be capable of being utilized as an isolation transformer (i.e., a transformer type functionality) as shown by related circuit illustration 810.

Figure 9:
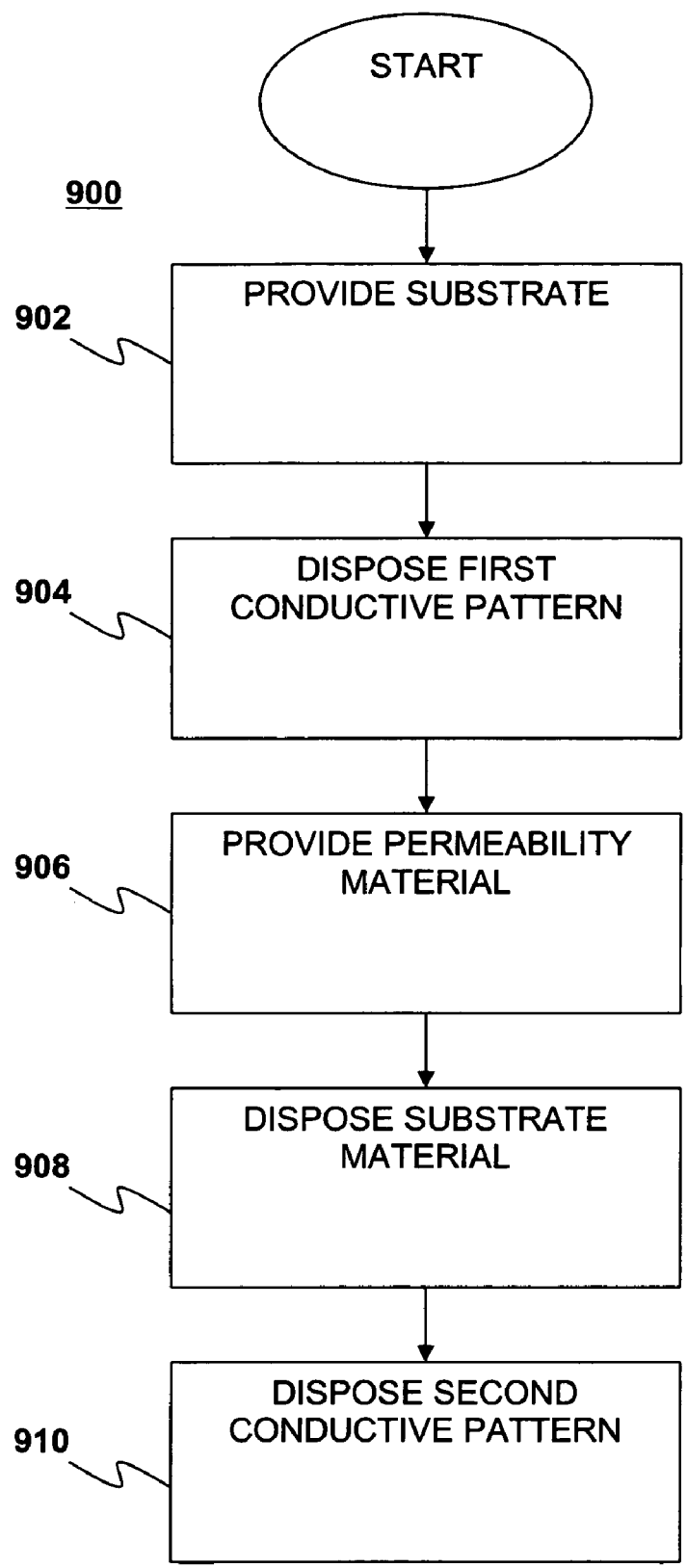
FIG. 9 illustrates a flow chart of one embodiment of a process for producing a magnetic component.

FIG. 9 illustrates a flow chart of one embodiment of a process for producing a magnetic component. As illustrated by flow chart 900 in FIG. 9, the process may start by providing a substrate, as indicated by block 902. As previously described, substrate may be of wide variety of materials that may be utilized to PCBs. Further, substrate may have a feature formed on the substrate utilizing a wide variety of approaches as previously described.

In the embodiment of FIG. 9, a first conductive pattern may be disposed over the feature and the substrate, as indicated by block 904.

At block 906, a permeability material may be disposed within the feature. A substrate material may be disposed over the permeability material and the substrate at block 908. At block 910, a second conductive pattern may be disposed on the substrate material, thereby facilitating a winding of the conductive patterns around the permeability material.

While there has been illustrated and/or described what are presently considered to be example embodiments of claimed subject matter, it will be understood by those skilled in the art that various other modifications may be made, and/or equivalents may be substituted, without departing from the true scope of claimed subject matter. Additionally, many modifications may be made to adapt a particular situation to the teachings of claimed subject matter without departing from subject matter that is claimed. Therefore, it is intended that the patent not be limited to the particular embodiments disclosed, but that it covers all embodiments falling within the scope of the appended claims.

What is claimed is:

1. An apparatus comprising:
   a substrate, the substrate having a feature and a first conductive pattern disposed on the feature;
   a permeability material disposed within the feature; and a substrate material disposed on the substrate to facilitate substantial enclosure of the permeability material between the substrate and the substrate material, the substrate material having a second conductive pattern, wherein the first conductive pattern and the second conductive pattern define at least one electrical circuit being adapted for coupling to a current source so as to cooperate to be capable of facilitating a magnetic field about the permeability material.

2. The apparatus of claim 1, wherein the substrate comprises a thermoplastic type material.

3. The apparatus of claim 2, wherein the thermoplastic type material comprises a polyetherimide type material.

4. The apparatus of claim 1, wherein the substrate comprises a resin type material.

5. The apparatus of claim 4, wherein the resin type material comprises a liquid crystal type material.

6. The apparatus of claim 1, wherein the feature comprises a feature having a toroidal type shape.

7. The apparatus of claim 1, wherein the feature comprises a feature formed by utilization of a machining type process.

8. The apparatus of claim 1, wherein the feature comprises a feature formed by utilization of a lithography type process.

9. The apparatus of claim 1, wherein the first conductive pattern comprises a conductive pattern that substantially lines portions of inside surfaces of the feature.

10. The apparatus of claim 1, wherein the first conductive pattern comprises a conductive pattern disposed by utilization of a stamping type approach.

11. The apparatus of claim 1, wherein the first conductive pattern comprises a conductive pattern disposed by utilization of a plating type approach.

12. The apparatus of claim 1, wherein the first conductive pattern comprises a conductive pattern disposed by utilization of a laser structuring type approach.

13. The apparatus of claim 1, wherein the permeability material comprises a ferromagnetic type material.

14. The apparatus of claim 1, wherein the permeability material comprises a separate solid object that substantially matches a shape of the feature.

15. The apparatus of claim 1, wherein the permeability material comprises a liquid type form material.

16. The apparatus of claim 1, wherein the permeability material comprises a powder type material.

17. The apparatus of claim 1, wherein the permeability material comprises a material utilized with a vibration based type approach.

18. The apparatus of claim 1, wherein the substrate material comprises one or more lamination layers.

19. The apparatus of claim 18, wherein the one or more lamination layers comprises one or more circuit layers.

20. The apparatus of claim 1, wherein the substrate material comprises a liquid dielectric type material.

21. The apparatus of claim 20, wherein the liquid dielectric type material comprises a liquid dielectric material disposed by utilization of at least one of a spray type, roller type, and/or a squeegee type approach.

22. The apparatus of claim 1, wherein the substrate material comprises a substrate material having the second conductive pattern disposed as part of a process of disposing the substrate material.

23. The apparatus of claim 1 further comprising the first and second conductive material facilitating a winding type structure around the permeability material.

24. The apparatus of claim 1 further comprising vias between the first conductive pattern and the second conductive pattern.

25. The apparatus of claim 1 further comprising interconnects between the first conductive pattern and the second conductive pattern.

26. The apparatus of claim 1, wherein the magnetic properties of the permeability material comprise magnetic properties capable of facilitating a common mode filter type functionality.

27. The apparatus of claim 1, wherein the magnetic properties of the permeability material comprise magnetic properties capable of facilitating an inductor type functionality.

28. The apparatus of claim 1, wherein the magnetic properties of the permeability material comprise magnetic properties capable of facilitating a transformer type functionality.

29. The apparatus of claim 1, wherein the feature depends from a first surface, wherein the feature defines a groove of revolution about an axis perpendicular to the first surface, the groove of revolution defining a groove surface surrounding a groove hub including a portion of the first surface, the substrate further including the first conductive pattern disposed on the feature.

30. The apparatus of claim 29, wherein the permeability material comprises a ferromagnetic type material.

31. The apparatus of claim 29, wherein the first conductive pattern comprises a plurality of discontinuous first conductive traces radiating from about the axis, the first conductive pattern extending from the groove hub along the groove surface to external the groove about a periphery of the groove, wherein the second conductive pattern comprises a plurality of discontinuous second conductive traces radiating from adjacent an axis, the second conductive traces extending from the groove hub to the groove periphery in electrical communication with the first conductive traces.

32. The apparatus of claim 31 wherein the first and second conductive patterns define at least one continuous winding beginning at a first interconnect and terminating at a second interconnect.

33. The apparatus of claim 29 further comprising vias between the first conductive pattern and the second conductive pattern coupling the first conductive pattern and the second conductive pattern in electrical communication.

34. The apparatus of claim 29, further comprising interconnects coupling in electrical communication the first conductive pattern and the second conductive pattern.

35. The apparatus of claim 29, wherein the first conductive pattern and second conductive pattern are electrically interconnected so as to define four interleaved electrical paths capable of facilitating a dual common mode filter type functionality.

36. The apparatus of claim 29, wherein the first conductive pattern and second conductive pattern are electrically interconnected so as to define two interleaved electrical paths capable of facilitating a single common mode filter type functionality.

37. The apparatus of claim 29, wherein the first conductive pattern and second conductive pattern are electrically interconnected so as to define two interleaved electrical paths capable of facilitating a single inductor type functionality.

38. The apparatus of claim 29, wherein the first conductive pattern and second conductive pattern are electrically interconnected so as to define two interleaved electrical paths capable of facilitating a transformer type functionality.

39. The apparatus of claim 29, wherein the substrate material includes a second surface, the substrate material having a second feature depending from the second surface, wherein the second feature defines a second groove of revolution about an axis perpendicular to the second surface, the second groove defining a second groove surface surrounding a second groove hub including a portion of the second surface, the substrate material further including the second conductive pattern disposed on the second feature, the substrate and substrate material in cooperative engagement so as to define a cavity defined by the first groove and the second groove.

40. The apparatus of claim 29, wherein the magnetic properties of the permeability material comprise magnetic properties capable of facilitating a transformer type functionality.

41. An apparatus comprising:
a substrate including a first surface, the substrate having a feature depending from the first surface, wherein the feature defines a groove of revolution about an axis perpendicular to the first surface, the groove defining a groove surface surrounding a groove hub including a portion of the first surface, the substrate further including a first conductive pattern disposed on the feature;
a permeability material disposed within the feature; and
a substrate material disposed on the first surface to facilitate substantial enclosure of the permeability material between the substrate and the substrate material, the substrate material having a second conductive pattern, wherein the first conductive pattern and the second conductive pattern are in electrical communication so as to define at least one electrical circuit adapted for coupling to a current source so as to cooperate to be capable of facilitating a magnetic field about the permeability material.

42. The apparatus of claim 41, wherein the feature defines a toroidal shape.

43. The apparatus of claim 41, wherein the permeability material comprises a ferromagnetic type material.

44. The apparatus of claim 41, wherein the first conductive pattern comprises a plurality of discontinuous first conductive traces radiating from about the axis, the first conductive pattern extending from the groove hub along the groove surface to external the groove about a periphery of the groove, wherein the second conductive pattern comprises a plurality of discontinuous second conductive traces radiating from adjacent an axis, the second conductive traces extending from the groove hub to the groove periphery in electrical communication with the first conductive traces.

45. The apparatus of claim 44 wherein the first and second conductive patterns define at least one continuous winding beginning at a first interconnect and terminating at a second interconnect.

46. The apparatus of claim 41 further comprising vias between the first conductive pattern and the second conductive pattern coupling the first conductive pattern and the second conductive pattern in electrical communication.

47. The apparatus of claim 41 further comprising interconnects coupling in electrical communication the first conductive pattern and the second conductive pattern.

48. The apparatus of claim 41, wherein the first conductive pattern and second conductive pattern are electrically interconnected so as to define four interleaved electrical paths capable of facilitating a dual common mode filter type functionality, and wherein the magnetic properties of the permeability material comprise magnetic properties capable of facilitating a dual common mode filter type functionality.

49. The apparatus of claim 41, wherein the first conductive pattern and second conductive pattern are electrically interconnected so as to define two interleaved electrical paths capable of facilitating a single common mode filter type functionality, and wherein the magnetic properties of the permeability material comprise magnetic properties capable of facilitating a single common mode filter type functionality.

50. The apparatus of claim 41, wherein the first conductive pattern and second conductive pattern are electrically interconnected so as to define two interleaved electrical paths capable of facilitating a single inductor type functionality, and wherein the magnetic properties of the permeability material comprise magnetic properties capable of facilitating a single inductor type functionality.

51. The apparatus of claim 41, wherein the first conductive pattern and second conductive pattern are electrically interconnected so as to define two interleaved electrical paths capable of facilitating a transformer type functionality, and wherein the magnetic properties of the permeability material comprise magnetic properties capable of facilitating a transformer type functionality.

52. The apparatus of claim 41, wherein the substrate material includes a second surface, the substrate material having a second feature depending from the second surface, wherein the second feature defines a second groove of revolution about an axis perpendicular to the second surface, the second groove defining a second groove surface surrounding a second groove hub including a portion of the second surface, the substrate material further including the second conductive pattern disposed on the second feature, the substrate and substrate material in cooperative engagement so as to define a cavity defined by the first groove and the second groove.

* * * * *